(12) United States Patent
Hsu et al.

(10) Patent No.: US 12,521,775 B2
(45) Date of Patent: Jan. 13, 2026

(54) SEMICONDUCTOR DEVICE MANUFACTURING SYSTEM AND METHOD FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Wei-Chun Hsu, Hsinchu (TW); Yung-Li Tsai, Miaoli County (TW); Sheng-Wei Wu, Hsinchu County (TW); Chih-Hao Chao, Hsinchu (TW); Yu-Hao Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 588 days.

(21) Appl. No.: 17/461,912

(22) Filed: Aug. 30, 2021

(65) Prior Publication Data
US 2023/0062848 A1    Mar. 2, 2023

(51) Int. Cl.
| | | |
|---|---|---|
| *B08B 13/00* | (2006.01) | |
| *B08B 3/02* | (2006.01) | |
| *B08B 3/04* | (2006.01) | |
| *B08B 3/08* | (2006.01) | |
| *G05B 19/418* | (2006.01) | |
| *G05D 7/06* | (2006.01) | |

(52) U.S. Cl.
CPC .............. *B08B 13/00* (2013.01); *B08B 3/022* (2013.01); *B08B 3/041* (2013.01); *B08B 3/08* (2013.01); *G05B 19/4183* (2013.01); *G05D 7/0635* (2013.01); *G05B 2219/41108* (2013.01); *G05B 2219/45031* (2013.01)

(58) Field of Classification Search
None
See application file for complete search history.

(56) References Cited

U.S. PATENT DOCUMENTS

| | | | | | |
|---|---|---|---|---|---|
| 5,826,129 | A | * | 10/1998 | Hasebe | H01L 21/67178 |
| | | | | | 414/416.03 |
| 6,228,561 | B1 | * | 5/2001 | Hasebe | G03F 7/162 |
| | | | | | 430/311 |
| 6,423,642 | B1 | * | 7/2002 | Peace | H01L 21/6708 |
| | | | | | 257/E21.309 |
| 10,058,900 | B2 | * | 8/2018 | Fujiwara | B08B 3/08 |
| 10,573,507 | B2 | * | 2/2020 | Yoshida | H01L 21/02057 |
| 2002/0192057 | A1 | * | 12/2002 | Meulen | H01L 21/67778 |
| | | | | | 414/217.1 |
| 2003/0213697 | A1 | * | 11/2003 | Chou | H01L 21/2885 |
| | | | | | 257/E21.175 |
| 2004/0112212 | A1 | * | 6/2004 | Jeng | B01D 46/46 |
| | | | | | 95/22 |

(Continued)

*Primary Examiner* — Carlos R Ortiz Rodriguez
(74) *Attorney, Agent, or Firm* — WPAT LAW; Anthony King

(57) ABSTRACT

A semiconductor device manufacturing system and a method for manufacturing semiconductor device are provided. The semiconductor device manufacturing system includes a substrate processing device and a processor. The substrate processing device includes a processing chamber, a gas supply module and a gas source. The processor is configured to monitor and control the gas supplied into the substrate processing device.

20 Claims, 3 Drawing Sheets

(56) References Cited

U.S. PATENT DOCUMENTS

| | | | | |
|---|---|---|---|---|
| 2004/0163683 A1* | 8/2004 | Sugimoto | H01L 21/67034 | 134/148 |
| 2006/0219264 A1* | 10/2006 | Miya | H01L 21/67051 | 134/21 |
| 2007/0175393 A1* | 8/2007 | Nishimura | H01J 37/32192 | 156/345.33 |
| 2007/0212816 A1* | 9/2007 | Nishimura | H01J 37/32743 | 438/109 |
| 2007/0227566 A1* | 10/2007 | Miya | H01L 21/67051 | 134/95.2 |
| 2009/0004877 A1* | 1/2009 | Asai | C23C 16/4405 | 438/758 |
| 2009/0107400 A1* | 4/2009 | Miya | H01L 21/67051 | 118/728 |
| 2009/0175709 A1* | 7/2009 | Okabe | H01L 21/67017 | 414/217 |
| 2011/0104879 A1* | 5/2011 | Hanashima | C23C 16/24 | 118/696 |
| 2011/0209560 A1* | 9/2011 | Ito | H01L 21/67051 | 73/861.42 |
| 2012/0052203 A1* | 3/2012 | Miyashita | C23C 16/4408 | 427/248.1 |
| 2012/0094011 A1* | 4/2012 | Hishiya | C23C 16/40 | 427/8 |
| 2012/0234356 A1* | 9/2012 | Nishi | H01L 21/02052 | 134/21 |
| 2013/0018500 A1* | 1/2013 | Porthouse | G05D 16/2046 | 700/104 |
| 2013/0081702 A1* | 4/2013 | Mohammed | F17D 3/00 | 137/2 |
| 2014/0065295 A1* | 3/2014 | Emoto | H01L 21/6708 | 118/52 |
| 2015/0200087 A1* | 7/2015 | Kobayashi | H01L 21/02334 | 134/30 |
| 2016/0244875 A1* | 8/2016 | Sasajima | H01L 21/02219 | |
| 2016/0284613 A1* | 9/2016 | Ikegawa | H01L 21/0228 | |
| 2017/0117135 A1* | 4/2017 | Yoshida | H01L 21/68742 | |
| 2017/0182515 A1* | 6/2017 | Emoto | H01L 21/67028 | |
| 2019/0127843 A1* | 5/2019 | Hsu | C23C 14/24 | |

* cited by examiner

SEMICONDUCTOR DEVICE MANUFACTURING SYSTEM AND METHOD FOR MANUFACTURING SEMICONDUCTOR DEVICE

BACKGROUND

Recent trends in the progression of semiconductor device fabrication have included the introduction of additional single wafer cleaning processes. Single water cleaning processes are replacing some wet-bench type cleans as they can provide for improved cleaning efficiency and process stability.

An issue with single wafer cleaning tools however is that the upper surface of the substrate may contact an atmosphere of a processing solution supplied to the lower surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
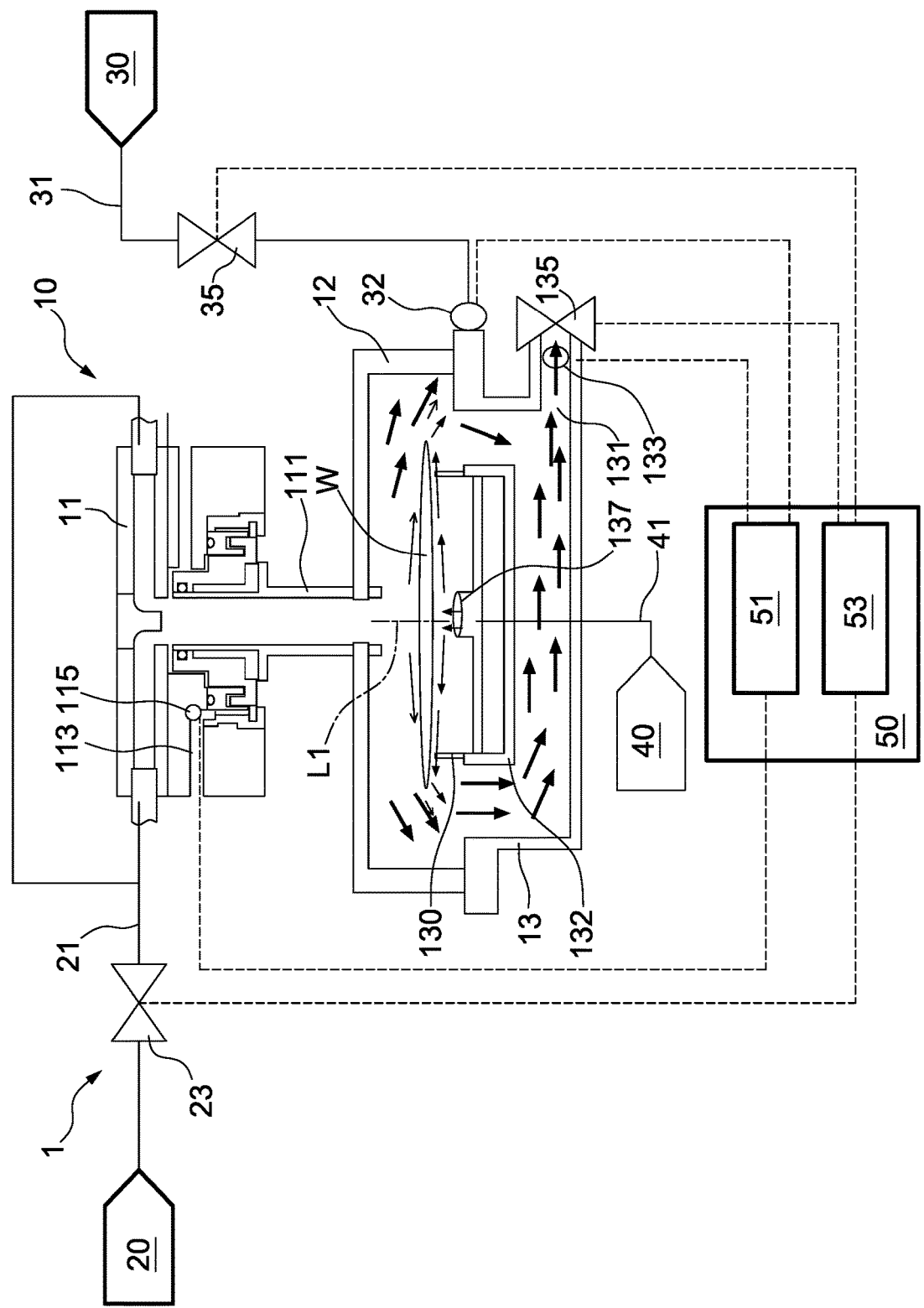
FIG. 1 is a schematic top view of a semiconductor device manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features the scope of the disclosure being defined by the claims appended hereto.

A common substrate processing device may include a holding member for horizontally holding a substrate from below and a nozzle provided between the holding member and the substrate. The nozzle is opposed to a central part of a lower surface of a substrate. The device discharges a processing solution from the nozzle toward a central part of the lower surface of the substrate while rotating the holding member. The discharged processing solution is moved from the central part of the lower surface to a peripheral edge part and is thus discharged from the peripheral edge part to an outside of the substrate in order to cover the whole lower surface of the substrate by centrifugal force. Consequently, the whole lower surface of the substrate is processed. However, an upper surface of the substrate may contact the processing solution or an atmosphere of the processing solution.

Present disclosure provides a semiconductor device manufacturing system that instantly and efficiently protects the upper surface of the substrate from the atmosphere of the processing solution supplied to the lower surface or the like.

FIG. 1 is a schematic top view of a semiconductor device manufacturing system 1 in accordance with some embodiments of the present disclosure. In some embodiments of the present disclosure, the semiconductor device manufacturing system 1 includes a substrate processing device 10 and a processor 50 connecting to the substrate processing device 10.

In some embodiments of the present disclosure, the processing device 10 includes a gas supply module 11, a shield plate 12 and a processing chamber 13. A spin base 130 is arranged in the processing chamber 13. The spin base 130 is configured to hold a substrate W in a substantially horizontal posture and rotate the substrate W around the perpendicular rotation axis L1 passing through a center of the substrate W, As shown in FIG. 1, the processing chamber 13 includes a processing portion 132 configured to perform a processing for a to-be-processed surface (a lower surface) of the substrate W held by the spin base 130. In some embodiments of the present disclosure, the processing portion 132 supplies a processing solution to the to-be-processed surface of the substrate W held by the spin base 130. Referring to FIG. 1, the processing portion 132 may include a nozzle 137 arranged underneath the substrate W held by the spin base 130. In some embodiments of the present disclosure, the nozzle 137 is connected to a supply pipe 41. The nozzle 137 includes a discharging port facing the lower surface of the substrate W which is held by the spin base 130 and is being rotated. The nozzle 137 is configured to discharge the processing solution supplied via the supply pipe 41 from the discharging port to the lower surface of the substrate W. The processing solution may include a "chemical solution" to be used in a chemical solution treatment and a "rinse liquid (which is also referred to as a "cleaning liquid")" to be used for a rinse processing for rinsing the chemical solution.

Further, as shown in FIG. 1, the supply pipe 41 is connected to a processing solution source 40 and configured to supply the processing solution from the processing solution source 40 to the nozzle 137. In some embodiments of the present disclosure, the processing solution source 40 includes an SC-1 (Standard clean-1) supply source, a DHF (dilute hydrofluoric acid) supply source, an SC-2 (Standard clean-2) supply source and a rinse liquid supply source. The SC-1 supply source is a supply source for supplying SC-1, The DHF supply source is a supply source for supplying DHF. The SC-2 supply source is a supply source for supplying SC-2. The rinse liquid supply source is a supply source for supplying a rinse liquid. In some embodiments of the present disclosure, the rinse liquid includes pure water, warm water, ozone water, magnetic water, reduced water (hydrogen water), various organic solvents (ion water, IPA (isopropyl alcohol), function water ($CO_2$ water, etc.) or the like. When the processing solution (SC-1, DHF, SC-2 or the rinse liquid) is supplied from the processing solution source 40 to the supply pipe 41, the processing solution is discharged from the nozzle 137 toward the vicinity of the center of the to-be-processed surface of the substrate W held by the spin base 130.

Referring to FIG. 1, the shield plate 12 is arranged above the processing chamber 13 and configured to match the processing chamber 13. When the shield plate 12 matches with the processing chamber 13, the spin base 130 and the substrate W held by the spin base 130 are covered by the shield plate 12. Further, the gas supply module 11 may be connected to the shield plate 12. In some embodiments of the present disclosure, the gas supply module 11 and the shield plate 12 are connected to a robot arm (not show) and could be moved by the robot arm.

The gas supply module 11 is configured to supply a gas (a cover gas) to the vicinity of the center of the upper surface of the substrate W held by the spin base 130, thereby protecting the upper surface of the substrate W from an atmosphere of a processing solution supplied to the lower surface or the like. The gas supply module 11 may include a cover gas nozzle 111 for discharging a gas toward the vicinity of the center of the upper surface of the substrate W held by the spin base 130. As shown in FIG. 1, a gas supply source 30 is connected to the gas supply module 11 through a pipe 21 and configured to supply the supplying a gas into the cover gas nozzle 111. The gas supplied from the gas supply source 20 includes a nitrogen ($N_2$) gas. Further, the pipe 21 may have a valve 23 inserted between the gas supply source 20 and the cover gas nozzle ill of the gas supply module 11. The valve 23 is configured to adjust a flow of the gas supplied from the gas supply source 30 to cover gas nozzle 111 of the gas supply module 11. Note that the gas supplied to the cover gas nozzle 111 may be a gas other than the nitrogen gas (for example, various inert gases, dry air and the like other than the nitrogen gas).

Referring to FIG. 1, the gas supply module 11 may include a manifold 113 connecting with the cover gas nozzle 111. A sensor 115 is arranged in the manifold 113 and configured to detect the gas passing through the cover gas nozzle 111. That is, the sensor 115 may be configured to detect the cover gas flow discharged on the upper surface of the substrate W. In some embodiments of the present disclosure, the sensor 115 includes a pressure gauge configured to detect a pressure of the gas passing through the cover gas nozzle 111 based on Bernoulli's Principle.

The processing chamber 13 may include an exhaust 131 configured to discharge the gas out of the interior of the processing chamber 13. Referring to FIG. 1, the exhaust 131 may include a valve 135 configured to control an open ratio of the exhaust 135, and thus the valve 135 may adjust a follow of the gas discharged out of the processing chamber 13. Further, the exhaust 131 may include a sensor 133 configured to detect the gas passing through the exhaust 131. In some embodiments of the present disclosure, the sensor 133 includes a pressure gauge configured to detect a pressure of the gas passing through the exhaust 131.

Moreover, a gas source 30 is connected to the process chamber 13 through a pipe 31 and configured to supply a gas into the processing chamber 13. The gas supplied from the gas supply source 30 includes a nitrogen ($N_2$) gas. Further, the pipe 31 may have a valve 35 inserted between the gas supply source 20 and the processing chamber 13. In some embodiments of the present disclosure, the gas source 30 includes a FFU (Fan Filter Unit) nitrogen gas source. In addition, the pipe 31 may include a sensor 32 between the valve 35 and the processing chamber 13 and configured to detect the gas supplied from the gas source 30 into the processing chamber 13. The sensor 32 may be arranged to be adjacent to the processing chamber 13. In some embodiments of the present disclosure. The sensor 32 is arranged on the sidewall of the processing chamber 13. In some embodiments of the present disclosure, the sensor 32 includes a pressure gauge configured to detect a pressure of the gas supplied from the gas source 30 into the processing chamber 13.

As shown in FIG. 1, the processor 50 may be connected to the substrate processing device 10. In some embodiments of the present disclosure, the processor 50 includes an analyzer module 51 and a controller module 53. The analyzer module 51 may connect the sensors 115, 32 and 133 and be configured to receive and analyze data detected by the sensors 115, 32 and 133. The controller module 53 may connect the valves 23, 35 and 135 and configured to control the valves 23, 35 and 135. In some embodiments of the present disclosure, the controller module 53 controls the valves 23, 35 and/or 135 based on the analysis from the analyzer module 51.

During the cleaning process of the substrate W, as mentioned above, the spin base 130 rotates the substrate W around the perpendicular rotation axis L1 passing through a center of the substrate W and the processing portion 132 supplies a processing solution to the lower surface (the to-be-processed surface) of the substrate W. Meanwhile, the gas supply module 11 supplies a gas (a cover gas) to the upper surface of the substrate W so as to protect the upper surface of the substrate W from an atmosphere of the processing solution supplied to the lower surface of the substrate W and/or to prevent the atmosphere of the processing solution from reflowing into the gas supply module 11. However, if the flow of the cover gas is insufficient to fully cover the upper surface of the substrate W, the atmosphere of the processing solution may contact the upper surface of the substrate W and may damage the upper surface of the substrate W. On the other hand, if the flow of the cover gas is excessive, the excessive cover gas flow may obstruct the processing solution to be supplied to the lower surface of the substrate W.

The semiconductor device manufacturing system 1 of the present disclosure is configured to efficiently and immediately adjust gas flows during the cleaning process of the substrate W. In some embodiments of the present disclosure, the sensor 115 includes a pressure gauge configured to detect a pressure of the gas passing through the cover gas nozzle 111 of the gas supply module 11 and discharged on the upper surface of the substrate W. In some embodiments of the present disclosure, the sensor 133 includes a pressure gauge configured to detect a pressure of the gas passing through the exhaust 131 and discharged out of the processing chamber 13. The analyzer module 51 of the processor 50 is configured to receive the data detected by the sensors 115 and 133 and analyze such data to check whether the cover gas supplied from the gas supply module 11 is insufficient to fully cover the upper surface of the substrate W or the cover gas supplied from the gas supply module 11 is excessive and obstructs the processing solution to be supplied to the lower surface of the substrate W. In other words, the analyzer module 51 of the processor 50 may obtain the information related to the flows of the cover gas and the atmosphere of the processing solution by analyzing the pressure data from the sensors 115 and 133. If the analyzer module 51 of the processor 50 finds that the cover gas supplied from the gas supply module 11 may be insufficient, the controller module 53 of the processor 50) may control the valve 23 and/or the valve 135 so as to increase the flow of the cover gas discharged on the upper surface of the substrate W and/or reduce the open ratio of the exhaust 131. Otherwise, if the analyzer module 51 of the processor 50 finds that the cover gas supplied from the gas supply module 11 may be excessive, the controller module 53 of the processor 50 may control the valve 23 and/or the valve 135 so as to reduce the flow of the cover gas discharged on the upper surface of the substrate W and/or increase the open ratio of the exhaust 131.

Moreover, when the cleaning process of the substrate W is not performed, the FFU gas source 30 may supply the gas into the processing chamber 13 so as to take the gas residue of the processing solution away from the processing chamber 13 and keep the interior of the processing chamber 13 in a clean condition. However, if the FFU gas supplied from the FFU gas source 30 into the processing chamber 13 is insufficient or excessive, the gas residue of the processing solution may be maintained in the processing chamber 13 and the interior of the processing chamber 13 may not be kept in a clean condition.

The semiconductor device manufacturing system 1 of the present disclosure is configured to efficiently and immediately adjust gas flows during the cleaning process of the processing chamber. In some embodiments of the present disclosure, the sensor 32 includes a pressure gauge configured to detect a pressure of the FFU gas supplied from the FFU gas source 30 into the processing chamber 13. In some embodiments of the present disclosure, the sensor 133 includes a pressure gauge configured to detect a pressure of the gas passing through the exhaust 131 and discharged out of the processing chamber 13. The analyzer module 51 of the processor 50 is configured to receive the data detected by the sensors 32 and 133 and analyze such data to check whether the FFU gas supplied into the processing chamber 13 is insufficient or excess to take the gas residue of the processing solution away from the processing chamber 13 and be able to keep the interior of the processing chamber 13 in a clean condition. In other words, the analyzer module 51 of the processor 50 may obtain the information related to the flow of the FFU gas in the processing chamber 13 by analyzing the pressure data from the sensors 32 and 133. If the analyzer module 51 of the processor 50 finds that the FFU gas supplied from the FFU gas source 30 may be insufficient, the controller module 53 of the processor 50 may control the valve 35 and/or the valve 135 so as to increase the flow of the FFU gas supplied into the processing chamber 13 and/or reduce the open ratio of the exhaust 131. Otherwise, if the analyzer module 51 of the processor 50 finds that the cover gas supplied from the gas supply module 11 may be excessive, the controller module 53 of the processor 50 may control the valve 35 and/or the valve 135 so as to reduce the flow of the FFU gas supplied into the processing chamber 13 and/or increase the open ratio of the exhaust 131.

Figure 2:
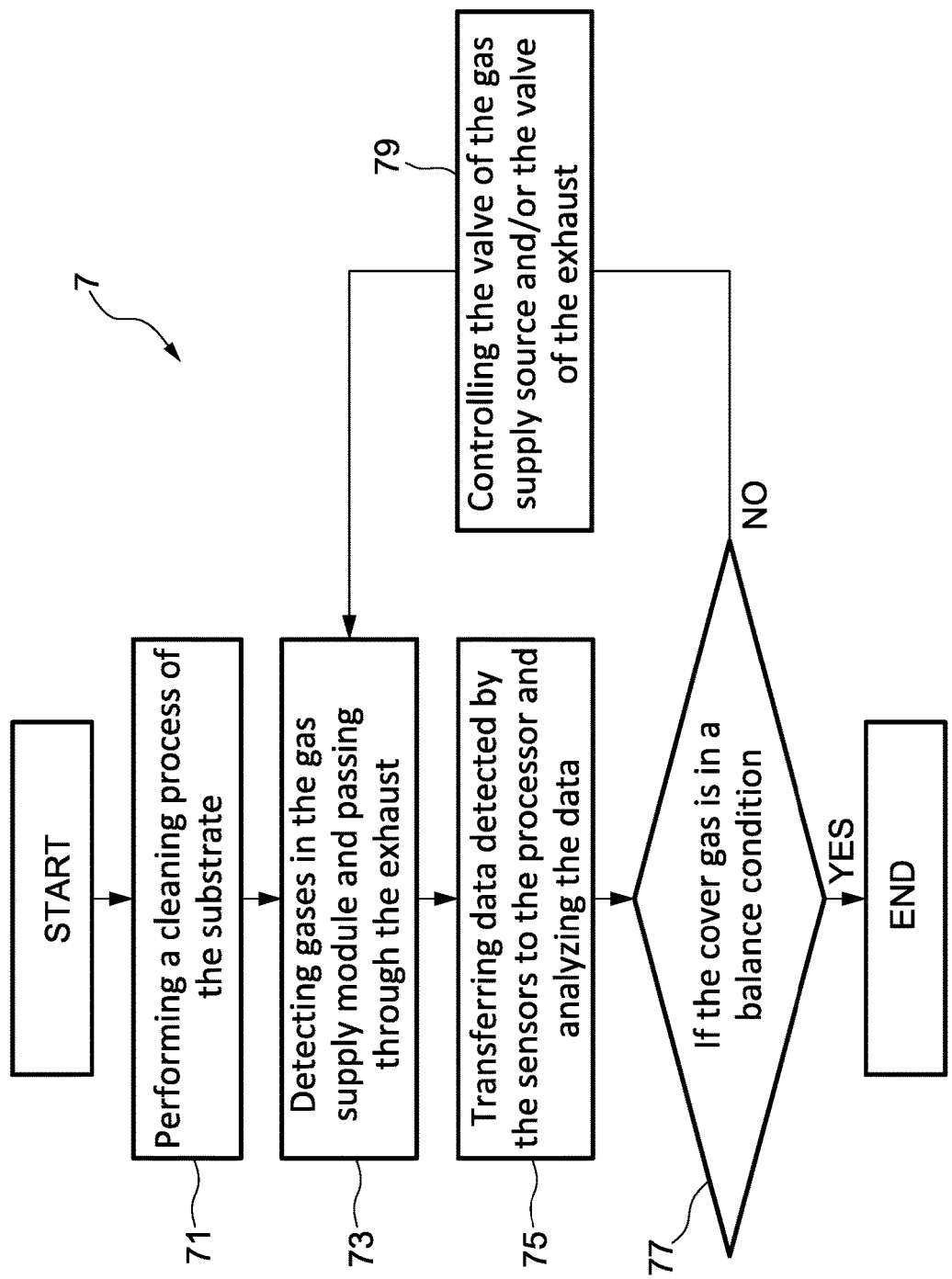
FIG. 2 is a flow chart representing exemplary operations of the method for manufacturing a semiconductor device by the semiconductor device manufacturing system, in accordance with some embodiments of the present disclosure.

FIG. 2 is a flow chart representing exemplary operations of the method for manufacturing a semiconductor device by the semiconductor device manufacturing system, in accordance with some embodiments of the present disclosure. The method 7 as shown in FIG. 2 is related to monitoring and adjusting the gas flow supplied from the gas supply module 1 into the processing chamber 3 during the cleaning process of the substrate W.

In operation 71, a cleaning process is performed with the substrate W. The substrate W is arranged on the spin base 130 in the processing chamber 13 and the gas supply module 11 is moved to be above and close to the upper surface of the substrate W. In some embodiments of the present disclosure, the shield plate 12 may be moved to match the processing chamber 13. Further, the spin base 130 rotates the substrate W around the perpendicular rotation axis L1 passing through a center of the substrate W and the processing portion 132 supplies a processing solution to the lower surface of the substrate W. In some embodiments of the present disclosure, the processing solution is supplied from the processing solution source 40 to the processing portion 132 through the pipe 41 and the nozzle 137 discharges the processing solution to the lower surface of the substrate W. At the same time, the gas supply module 11 discharges the cover gas to the upper surface of the substrate W so as to protect the upper surface of the substrate W from the atmosphere of the processing solution supplied to the lower surface of the substrate W and/or to prevent the atmosphere of the processing solution from reflowing into the gas supply module 11. In some embodiments of the present disclosure, the cover gas includes nitrogen gas and is supplied from the gas supply source 20 through the pipe 21. After the cover gas is discharged on the upper surface of the substrate W by the gas supply module 11 the cover gas and the atmosphere of the processing solution may further flow into the interior of the processing chamber 13 and then flow out of the processing chamber 13 through the exhaust 131.

In operation 73, the sensor 115, which is arranged in the gas supply module 11, detects the cover gas flow supplied from the gas supply module H and discharged on the upper surface of the substrate W. and the sensor 133, which is arranged in the exhaust 133 of the processing chamber 13, detects the gas flow passing through the exhaust 131 and discharged out of the processing chamber 13. In some embodiments of the present disclosure, the sensor 115 includes a pressure gauge configured to detect the pressure of the cover gas passing through the cover gas nozzle 111 of the gas supply module 11. In some embodiments of the present disclosure, the sensor 133 includes a pressure con- figured to detect the pressure of the gas passing through the exhaust 131.

In operation 75, the sensors 113 and 133 transfer pressure data to the processor 50. After the processor 50 receives the pressure data detected by the sensors 113 and 133, the analyzer 51 of the processor 50 analyzes the pressure data and determines whether the cover gas flow is sufficient to protect the upper surface of the substrate W from the atmosphere of the processing solution and/or to prevent the atmosphere of the processing solution from reflowing into the gas supply module 11.

In operations 77, the processor 50 determines whether the cover gas discharged on the upper surface of the substrate W is in a balance condition based on the analysis of the pressure data. If the processor 50 finds that the cover gas flow is insufficient or excessive, the controller module 53 will adjust the cover gas flow discharged on the upper surface of the substrate W and/or the gas flow discharged out of processing chamber 13 such that the cover gas supplied into the processing chamber could be maintained in a balance condition.

In operation 79, when the processor 50 finds that the difference between the pressure value detected by the sensor 115 and the pressure value detected by the sensor 133 is too low and/or the pressure value detected by the sensor 115 is too low and/or the pressure value detected by the sensor 133 is too low, it means that the cover gas flow discharged on the upper surface of the substrate W may be insufficient to protect the upper surface of the substrate W from the atmosphere of the processing solution and/or to prevent the atmosphere of the processing solution from reflowing into the gas supply module 11. The controller module 53 of the processor 50 may control valve 23 of the supply gas source 20 so as to increase the cover gas flow supplied from the gas supply module 11 into the processing chamber 13 and/or control the valve 135 of the exhaust 131 to decrease the open ratio of the exhaust 131 such that there is more cover gas maintained in the processing chamber 13.

Further, when the processor 50 finds that the difference between the pressure value detected by the sensor 115 and the pressure value detected by the sensor 133 is too high and/or the pressure value detected by the sensor 115 is too high and/or the pressure value detected by the sensor 133 is too high, it means that the cover gas flow discharged on the upper surface of the substrate W may be excessive and may obstruct the processing solution to be supplied to the lower surface of the substrate W. The controller module 53 of the processor 50 may control valve 23 of the supply gas source 20 so as to decrease the cover gas flow supplied from the gas supply module 11 into the processing chamber 13 and/or control the valve 135 of the exhaust 131 to increase the open ratio of the exhaust 131 such that the cover gas could be discharged out of the processing chamber 13 more quickly.

After the flow of the cover gas discharged on the upper surface of the substrate W and/or the flow of the gas discharged out of the processing chamber 13 have been adjusted, the sensors 113 and 133 may further detect the cover gas flow supplied into the processing chamber 13 and the gas flow passing through the exhaust 131 of the processing chamber 13 (the operation 73). The processor 50 may further receive and analyze the data detected by the sensors 115 and 133 (the operation 75) and determine whether the cover gas is in a balance condition (the operation 77). If not, the controller module 53 of the processor 50 may further control the valve 23 of the supply gas source 20 and/or the valve 135 of the exhaust 131 so as to adjust the cover gas flow supplied into the processing chamber 13 and/or the gas flow discharged out of the processing chamber 13 (the operation 79). In other words, there may be a loop among the operations 73, 75, 77 and 79.

Figure 3:
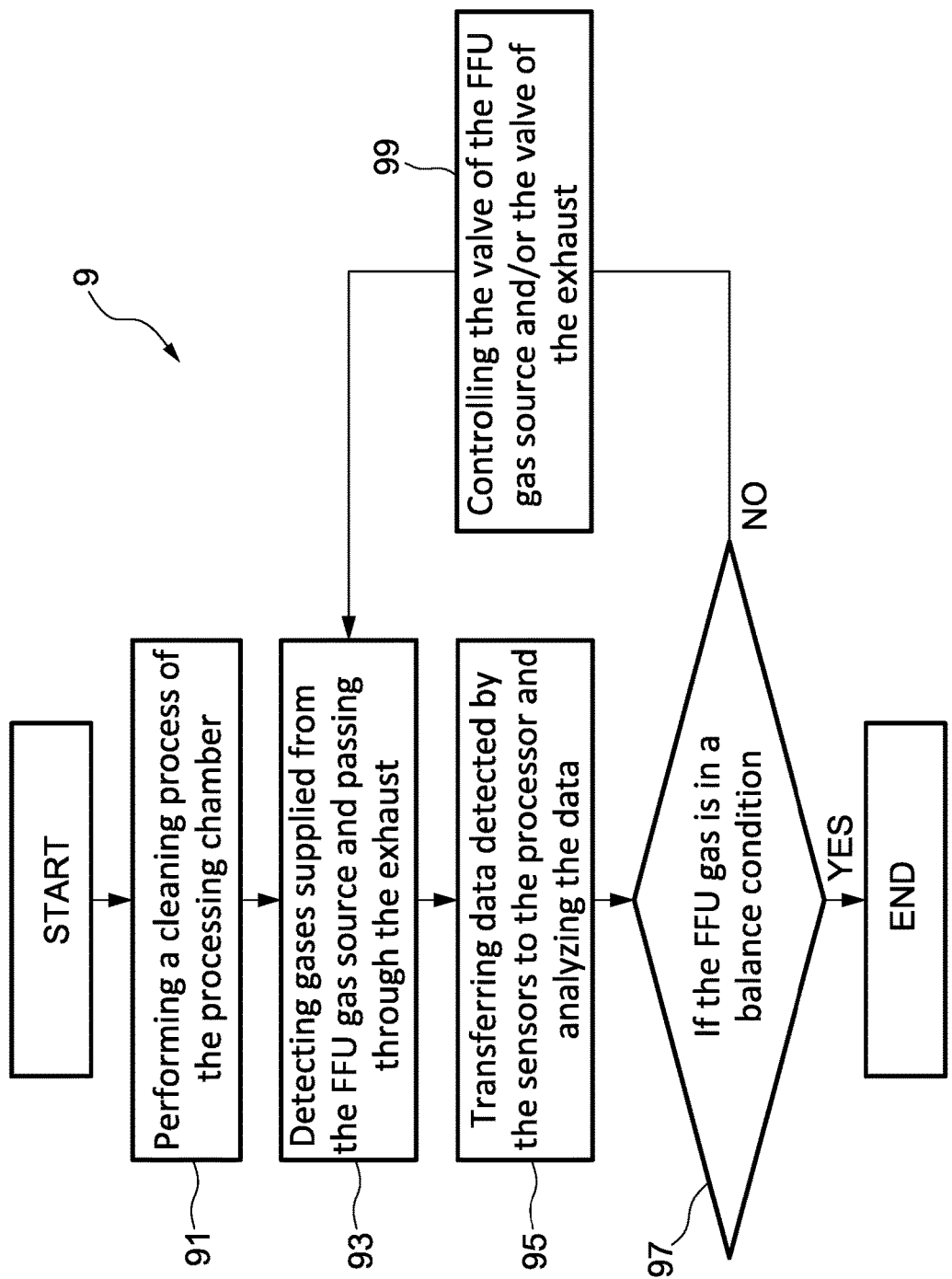
FIG. 3 is a flow chart representing exemplary operations of the method for manufacturing a semiconductor device by the semiconductor device manufacturing system, in accordance with some embodiments of the present disclosure.

FIG. 3 is a flow chart representing exemplary operations of the method for manufacturing a semiconductor device by the semiconductor device manufacturing system, in accordance with some embodiments of the present disclosure. The method 9 as shown in FIG. 3 is related to monitoring and adjusting the FFU gas flow supplied from the FFU gas source 30 into the processing chamber 3 during the cleaning process of the processing chamber 13.

In operation 91, a cleaning process is performed with the processing chamber 13. When the cleaning process of the substrate W is not performed, the FFU gas source 30 may supply the FFU gas into the processing chamber 13. In some embodiments of the present disclosure, the FFU gas supplied from the FFU gas source includes nitrogen gas. Further, the FFU gas may take the gas residue of the processing solution away from the processing chamber 13 when the FFU gas is discharged out of the processing chamber 13, and thus the interior of the processing chamber may be kept in a clean condition.

In operation 93, the sensor 32, which may connect to the pipe 31 and be located adjacent to the processing chamber 13, detects the FFU gas flow supplied from the FFU gas source 30 into the processing chamber 13, and the sensor 133, which is arranged in the exhaust 131 of the processing chamber 13, detects the gas flow passing through the exhaust 131 and discharged out of the processing chamber 13. In some embodiments of the present disclosure, the sensor 32 includes a pressure gauge configured to detect the pressure of the FFU gas flow supplied into the processing chamber 13. In some embodiments of the present disclosure, the sensor 133 includes a pressure configured to detect the pressure of the gas passing through the exhaust 131.

In operation 95, the sensors 32 and 133 transfer pressure data to the processor 50. After the processor 50 receives the pressure data detected by the sensors 32 and 133, the analyzer 51 of the processor 50 analyzes the pressure data and determines whether the FFU gas flow is sufficient to take the gas residue of the processing solution away from the processing chamber 13 and keep the interior of the processing chamber 13 in a clean condition.

In operations 97, the processor 50 determines whether the FFU gas supplied into the processing chamber is in a balance condition based on the analysis of the pressure data. If the processor 50 finds that the FFU gas flow is insufficient or excessive, the controller module 53 will adjust the FFU gas flow supplied from the FFU gas source 30 and/or the gas flow discharged out of processing chamber 13 such that the FFU gas supplied into the processing chamber could be maintained in a balance condition.

In operation 99, when the processor 50 finds that the difference between the pressure value detected by the sensor 32 and the pressure value detected by the sensor 133 is too low and/or the pressure value detected by the sensor 32 is too low and/or the pressure value detected by the sensor 133 is too low, it means that the FFU gas flow supplied into the processing chamber 13 may be insufficient to take the gas residue of the processing solution away from the processing chamber 13. The controller module 53 of the processor 50 may control valve 35 of the FFU gas source 30 so as to increase the FFU gas flow supplied into the processing chamber 13 and/or control the valve 135 of the exhaust 131 to decrease the open ratio of the exhaust 131 such that there is more FFU gas maintained in the processing chamber 13.

Further, when the processor 50 finds that the difference between the pressure value detected by the sensor 32 and the pressure value detected by the sensor 133 is too high and/or the pressure value detected by the sensor 32 is too high and/or the pressure value detected by the sensor 133 is too high, it means that the FFU gas flow supplied into the processing chamber 13 may be excessive and the FFU gas in the processing chamber 13 is not in a balance condition.

The controller module 53 of the processor 50 may control valve 35 of the FFU gas source 20 so as to decrease the FFU gas flow supplied into the processing chamber 13 and/or control the valve 135 of the exhaust 131 to increase the open ratio of the exhaust 131 such that the FFU gas could be discharged out of the processing chamber 13 more quickly.

After the FFU gas flow supplied into the processing chamber 13 has been adjusted, the sensors 32 and 133 may further detect the FFU gas flow supplied into the processing chamber 13 and the gas flow passing through the exhaust 131 of the processing chamber 13 (the operation 93), The processor 50 may further receive and analyze the data detected by the sensors 32 and 133 (the operation 95) and determine whether the FFU gas is in a balance condition (the operation 97). If not, the controller module 53 of the processor 50 may further control the valve 35 of the FFU gas source 30 and/or the valve 135 of the exhaust so as to adjust the FFU gas flow supplied into the processing chamber 13 and/or the gas flow discharged out of the processing chamber 13 (the operation 99). In other words, there may be a loop among the operations 93, 95, 97 and 99.

It will be further appreciated that the foregoing system may be used for maintaining the cover gas and/or the FFU gas in the substrate processing device in a balance condition.

According to one embodiment of the present disclosure, a semiconductor device manufacturing system comprises a substrate processing device and a processor. The substrate processing device comprises a processing chamber, a gas supply module above the processing chamber and configured to supply gas into the processing chamber and a gas source connected to the gas supply module through a pipe having a first valve inserted therebetween. The gas supply module has a first sensor configured to detect the gas supplied into the processing chamber. The processing chamber has a second sensor and an exhaust with a second valve. The exhaust is configured to discharge gas out of the processing chamber. The second sensor is configured to detect the gas passing through the exhaust. Further, the processor connects the first valve, the second valve, the first sensor and the second sensor and is configured to receive data from the first sensor and/or the second sensor and control the first valve and/or the second valve.

According to another embodiment of the present disclosure, a semiconductor device manufacturing system, comprise a substrate processing device and a processor. The substrate processing device comprises processing chamber and a gas source connected to the processing chamber through a pipe having a first valve inserted therebetween. The gas source is configured to supply a gas into the processing chamber. The pipe comprises a first sensor between the first valve and the processing chamber and configured to detect the gas supplied from the gas source into the processing chamber. The processing chamber has a second sensor and an exhaust with a second valve. The exhaust is configured to discharge gas out of the processing chamber and the second sensor is configured to detect the gas passing through the exhaust. Further, the processor connects the first valve, the second valve, the first sensor and the second sensor and is configured to receive data from the first sensor and/or the second sensor and control the first valve and/or the second valve.

According to one embodiment of the present disclosure, a method of manufacturing a semiconductor device, comprising: detecting a gas supplied into a processing chamber of a substrate processing device by a first sensor; detecting another gas passing through an exhaust of the processing chamber of the substrate processing device by a second sensor; obtaining data from the first sensor and the second sensor; analyzing the data obtained from the first sensor and the second sensor; and controlling a flow of the gas suppled into the processing chamber and/or an open ratio of the exhaust of the processing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device manufacturing system for cleaning a wafer, comprising:
   a substrate processing device, comprising:
      a processing chamber configured to receive and rotate the wafer;
      a gas supply module above the processing chamber and has a nozzle in fluid communication with the processing chamber and configured to supply gas to a central area of an upper surface of the wafer when the wafer is rotated about an axis extending through a center of the wafer;
      a first gas source connected to the gas supply module through a first pipe having a first valve inserted therebetween, wherein the gas supply module has a first sensor configured to detect a pressure of the gas supplied into the processing chamber and supply to the upper surface of the wafer through the nozzle of the gas supply module, wherein the processing chamber has a second sensor and an exhaust with a second valve, and wherein the exhaust is configured to discharge gas out of the processing chamber and the second sensor is configured to detect a pressure of the gas passing through the exhaust; and
      a processing portion having a processing solution nozzle and a processing solution source in fluid communication with the resin solution nozzle, wherein the processing solution is configured to supply a processing solution from the processing solution source to a central area of a lower surface of the wafer when the wafer is rotated about the axis extending through the center of the wafer; and
   a processor connecting the first valve, the second valve, the first sensor and the second sensor and configured to receive detected pressure data from the first sensor and/or the second sensor, analyze the detected pressure data to determine whether the gas supplied to the central area of the upper surface of the wafer is insufficient or excessive to judge whether the gas is in a balance condition and dynamically adjust the first valve and/or the second valve based on determination to maintain the balance condition.

2. The semiconductor device manufacturing system of claim 1, wherein the gas supply module comprises a manifold connecting with the nozzle, and wherein the first sensor is arranged in the manifold.

3. The semiconductor device manufacturing system of claim 1, wherein the first gas source comprises a nitrogen gas source.

4. The semiconductor device manufacturing system of claim 1, wherein the first sensor comprises a pressure gauge configured to detect a pressure of the gas passing through the nozzle of gas supply module.

5. The semiconductor device manufacturing system of claim 1, wherein the second sensor comprises a pressure gauge.

6. The semiconductor device manufacturing system of claim 1, wherein the nozzle of the gas supply module substantially aligns with the axis.

7. The semiconductor device manufacturing system of claim 1, wherein the gas discharged from the nozzle of the gas supply module to the central portion of the upper surface of the wafer is configured to protect the upper surface of the substrate from an atmosphere of the processing solution.

8. The semiconductor device manufacturing system of claim 1, further comprising a FFU gas source connected to the processing chamber through a second pipe having a third valve inserted therebetween, wherein the FFU gas source is configured to supply a FFU gas into the processing chamber, and wherein the second pipe comprises a third sensor between the third valve and the processing chamber and configured to detect the FFU gas supplied from the FFU gas source into the processing chamber, and wherein the processor connects the third valve and the third sensor and configured to receive data from the third sensor and control the third valve.

9. The semiconductor device manufacturing system of claim 1, wherein the processing solution nozzle of the gas supply module substantially aligns with the axis.

10. A method of manufacturing a semiconductor device, comprising:
providing the wafer in a processing chamber;
rotating the wafer about an axis extending through a center of the wafer;
supplying a gas to a central area of an upper surface of the wafer;
supplying a processing solution to a central area of a lower surface of the wafer;
discharging the gas out of the processing chamber through an exhaust of the processing chamber;
collecting a first pressure data related to the gas supplied to the central area of the upper surface of the wafer by a first pressure sensor;
collecting a second pressure data related to the gas passing through the exhaust of the processing chamber by a second pressure sensor;
analyzing the first pressure data and the second pressure data to determine whether the gas supplied to the central area of the upper surface of the wafer is insufficient or excessive to judge whether the gas is in a balance condition; and
dynamically adjusting a flow of the gas supplied to the central area of the upper surface of the substrate and/or an open ratio of the exhaust of the processing chamber based on determination to maintain the balance condition;
wherein the method is configured to clean the wafer provided and rotated in the processing chamber.

11. The method of claim 10, further comprising:
supplying a FFU gas into the processing chamber of the substrate processing device;
discharging the FFU gas out of the processing chamber through the exhaust;
collecting a third data related to the FFU gas supplied into the processing chamber of the substrate processing device;
collecting a fourth data related to the FFU gas passing through the exhaust; and
controlling a flow of the FFU gas supplied into the processing chamber and/or the open ratio of the exhaust of the processing chamber based on the third data and/or the fourth data.

12. The method of claim 11, further comprising: stopping a rotation of the substrate and a supply of the processing solution while supplying the FFU gas into the processing chamber of the substrate processing device and discharging the FFU gas out of the processing chamber through the exhaust.

13. A semiconductor device manufacturing system for cleaning a wafer, comprising:
a processing chamber has a spin base configured to hold the wafer and rotate the wafer about an axis passing through a center of the wafer and a processing portion configured to supply a processing solution to a lower surface of the wafer;
a first gas supply device in fluid communication with the processing chamber and configured to discharge a gas toward an upper surface of the wafer when the wafer is rotated, wherein the first gas supply device has a first pressure sensor configured to detect a pressure of the gas supplied into the processing chamber and discharged toward the upper surface of the wafer and a first valve configured to control a flow of the gas supplied into the processing chamber and discharged toward the upper surface of the wafer;
an exhaust in fluid communication with the process chamber and configured to discharge the gas out of the processing chamber, wherein the exhaust has a second pressure sensor configured to detect a pressure of the gas passing through the exhaust and a second valve configured to control an open ratio of the exhaust; and
a controller connected to the first pressure sensor, the first valve, the second pressure sensor and the second valve and configured to receive pressure data from the first pressure sensor and/or the second pressure sensor, analyze the received pressure date to determine whether the gas discharged toward the upper surface of the wafer is insufficient or excessive, and dynamically adjust the first valve and/or the second valve based on determination to maintain a balance condition of the gas discharged toward the upper surface of the wafer;
wherein the first gas supply device has a gas nozzle substantially aligned with a central region of the upper surface of the wafer, and wherein the first gas supply device is configured to discharge the gas toward the upper surface of the wafer through the gas nozzle;
wherein the processing portion has a processing solution nozzle substantially aligned with a central region of the lower surface of the wafer, and wherein the processing portion is configured to supply the processing solution to the lower surface of the wafer through the processing solution nozzle.

14. The semiconductor device manufacturing system of claim 13, further comprising a FFU gas source in fluid communication with the processing chamber and configured to discharge a FFU gas into the processing chamber, wherein the FFU has a third pressure sensor configured to detect the FFU gas supplied into the processing chamber and a third valve configured to control a flow of the FFU gas supplied into the processing chamber, and wherein the controller connected to the third pressure sensor and the third valve and configured to control the second valve and/or the third valve in response to data from the second pressure sensor and/or the third pressure sensor.

15. The semiconductor device manufacturing system of claim 13, wherein the processing solution comprises a chemical solution and a rinse liquid.

16. The semiconductor device manufacturing system of claim 13, wherein, when the spin base rotates the substrate and the first gas supply device discharges the gas toward the upper surface of the substrate and the processing portion supplies the processing solution to the lower surface of the substrate, the controller receives the data from the first pressure sensor/and the second pressure sensor and controls the first valve and/or the second valve based on the data from the first pressure sensor/and the second pressure sensor.

17. The semiconductor device manufacturing system of claim 14, wherein the FFU gas supply device discharge the FFU gas into the processing chamber when the spin base stops rotating the substrate and the processing portion stops supplying the processing solution to the lower surface of the substrate.

18. The semiconductor device manufacturing system of claim 17, wherein, meanwhile, the controller receives the data from the second pressure sensor/and the third pressure sensor and controls the second valve and/or the third valve based on the data from the first pressure sensor/and the second pressure sensor.

19. The semiconductor device manufacturing system of claim 15, wherein the gas discharged from the first gas supply device comprises nitrogen ($N_2$) gas.

20. The semiconductor device manufacturing system of claim 17, wherein the FFU gas is configured to take gas residue of the processing solution away from the processing chamber.

* * * * *